United States Patent [19]

Tepman et al.

[11] Patent Number: 5,186,718
[45] Date of Patent: Feb. 16, 1993

[54] STAGED-VACUUM WAFER PROCESSING SYSTEM AND METHOD

[75] Inventors: Avi Tepman, Cupertino; Howard Grunes, Santa Cruz; Sasson Somekh; Dan Maydan, both of Los Altos Hills, all of Calif.

[73] Assignee: Applied Materials, Inc., Santa Clara, Calif.

[21] Appl. No.: 685,976

[22] Filed: Apr. 15, 1991

Related U.S. Application Data

[63] Continuation of Ser. No. 355,008, May 19, 1989, abandoned.

[51] Int. Cl.⁵ .............................................. C23C 13/08
[52] U.S. Cl. .......................... 29/25.01; 148/DIG. 6; 148/DIG. 169; 29/25.02; 437/925; 204/192.12
[58] Field of Search .................. 148/DIG. 6, 21, 25, 148/22, 169; 118/715, 719, 50.1, 620; 29/25.01, 25.02, 25.03; 437/81, 105-107, 926, 925; 204/192, 12, 298

[56] References Cited

U.S. PATENT DOCUMENTS

| | | | |
|---|---|---|---|
| 4,405,435 | 9/1983 | Tateishi et al. | 204/298 |
| 4,498,416 | 2/1985 | Bouchaib | 118/719 |
| 4,592,306 | 6/1986 | Gallego | 118/719 |
| 4,607,593 | 8/1986 | Van Hemel | 118/719 |
| 4,664,062 | 5/1987 | Kamohara et al. | 118/719 |
| 4,681,773 | 7/1987 | Bean | 118/719 |
| 4,709,655 | 12/1987 | Van Mastrigt | 118/50.1 |
| 4,715,921 | 12/1987 | Maher et al. | 156/345 |
| 4,717,461 | 1/1988 | Strahl et al. | 204/192.1 |
| 4,733,631 | 3/1988 | Boyarski et al. | 118/719 |
| 4,820,106 | 4/1989 | Walde et al. | 118/719 |
| 4,825,808 | 5/1989 | Takahashi et al. | 118/719 |
| 4,857,160 | 8/1989 | Landau et al. | 204/192.12 |
| 4,886,592 | 12/1989 | Andrele et al. | 204/298 |

FOREIGN PATENT DOCUMENTS

| | | |
|---|---|---|
| 87302958.1 | 11/1987 | European Pat. Off. . |
| 87311194.2 | 6/1988 | European Pat. Off. . |
| 0221572 | 11/1985 | Japan ................... 118/719 |
| 1170568 | 8/1986 | Japan ................... 118/719 |
| 1246381 | 11/1986 | Japan ................... 118/719 |
| 2116769 | 5/1987 | Japan ................... 118/719 |
| 2131455 | 6/1987 | Japan ................... 118/719 |
| 2164875 | 7/1987 | Japan ................... 118/719 |
| PCT/US87/01176 | 12/1987 | PCT Int'l Appl. . |

*Primary Examiner*—Olik Chaudhuri
*Assistant Examiner*—David E. Graybill
*Attorney, Agent, or Firm*—Philip A. Dalton

[57] ABSTRACT

A processing system for workpieces such as semiconductor wafers is disclosed which incorporates multiple, isolated vacuum stages between the cassette load lock station and the main vacuum processing chambers. A vacuum gradient is applied between the cassette load lock and the main processing chambers to facilitate the use of a very high degree of vacuum in the processing chambers without lengthy pump down times. Separate robot chambers are associated with the vacuum processing chambers and the load lock(s). In addition, separate transport paths are provided between the two robot chambers to facilitate loading and unloading of workpieces. Pre-treatment and post-treatment chambers may be incorporated in the two transport paths.

23 Claims, 4 Drawing Sheets

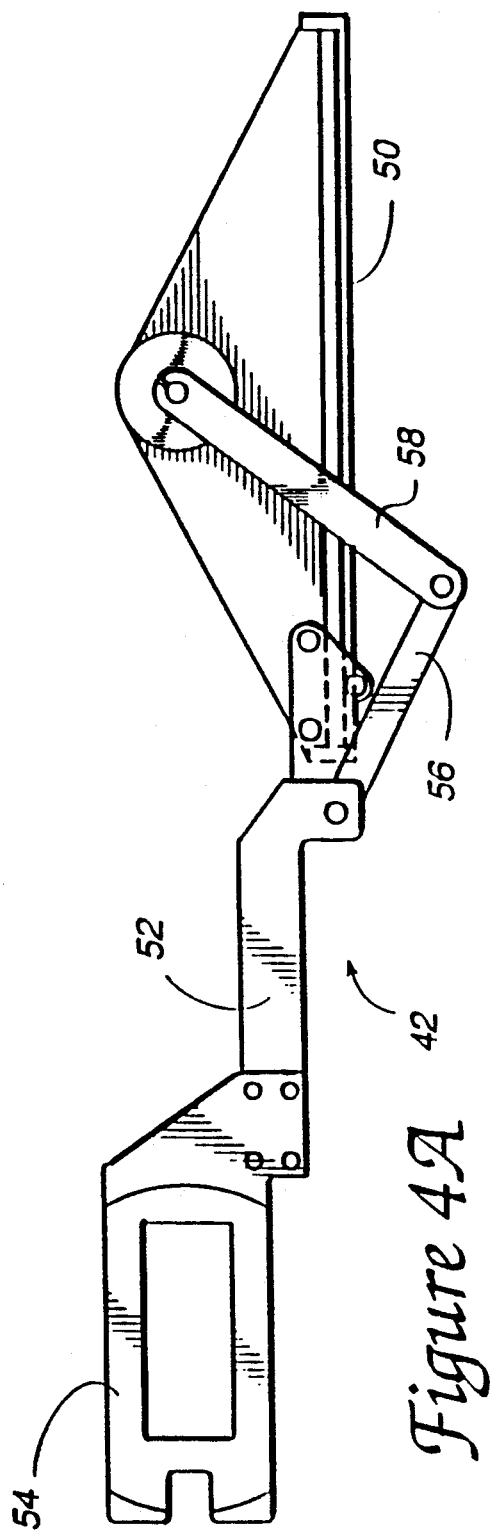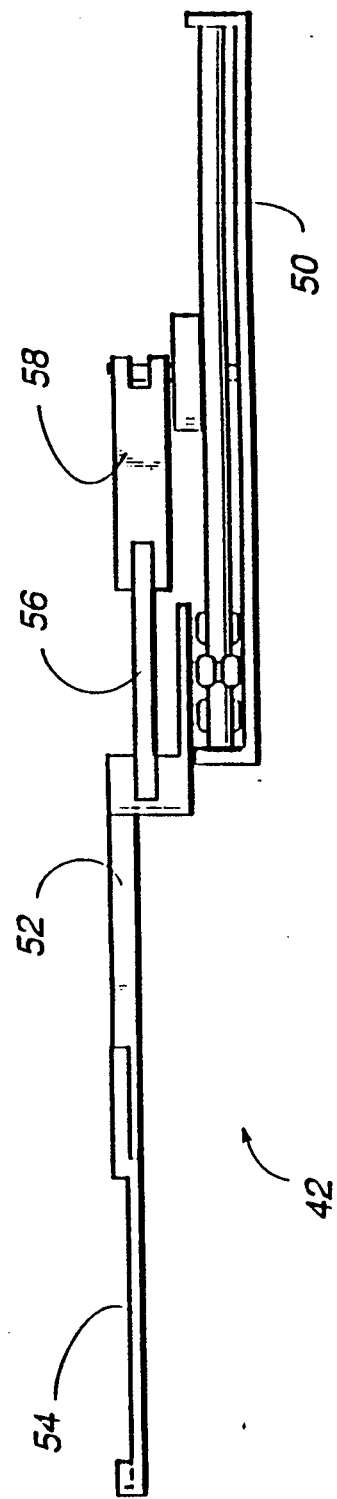

STAGED-VACUUM WAFER PROCESSING SYSTEM AND METHOD

This is a continuation of application Ser. No. 355,008, filed May 19, 1989, now abandoned.

BACKGROUND OF THE INVENTION

The present invention relates generally to semiconductor wafer vacuum processing systems and to single wafer, cassette-to-cassette, robot vacuum processing systems.

In order to decrease contamination and to enhance through-put, a number of recently introduced, single-wafer processing chambers use a system configuration comprising a wafer transfer robot which transports wafers between a cassette load lock and plural/multiple vacuum processing chambers. Access (1) between the individual process chambers and (2) between the robot chamber and the load lock chamber is via slit valves which selectively isolate the process chambers from the robot and the robot from the load lock chamber. This configuration permits processing in one or more chambers while wafers are being loaded or unloaded at other process chambers or at the load lock chamber and permits random access, in vacuo wafer transfer from one processing chamber to another via the robot chamber.

An article entitled "Dry Etching Systems: Gearing Up for Larger Wafers", in the October, 1985 issue of Semiconductor International magazine, pages 48-60, discloses such a system and specifically, a four-chamber dry etching system in which a robot in a pentagonal-shaped housing serves four plasma etching chambers and a cassette load/unload load lock chamber mounted on the robot housing.

Despite the increased vacuum isolation provided by such state-of-the-art systems, to our knowledge typically such systems have difficulty providing commercially acceptable throughput for high vacuum processes, for example, physical vapor processes such as sputtering. Specifically, the time required to pump down processing chambers or their load lock chambers to their base level, following loading of wafers into the chambers, is excessive.

SUMMARY OF THE INVENTION

1. Objects

In view of the above discussion, it is one object of the present invention to provide a processing system for workpieces such as semiconductor wafers which is configured to minimize the time required to pump down the system's chambers to their base vacuum level after loading of wafers therein.

It is a related object to decrease contamination and increase throughput by pre-cleaning and otherwise pre-treating wafers within the system prior to their entering high vacuum regions.

It is another object to provide a system as described above which is adapted for minimizing the pump down time and, thus, increasing throughput for very high vacuum chambers, for example, for physical vapor processing chambers such as those used for sputtering.

It is still another, related objective to provide a vacuum processing system which enhances processing capability and throughput by providing separate isolatable, wafer transport paths.

2. Summary

In one aspect, our invention is encompassed in a workpiece transport system, and its method of operation, which achieves at least selected ones of the above objects and comprises first and second vacuum chambers, including respective first and second robot means therein for loading and unloading workpieces; and a pair of passages interconnecting the first and second robot-containing chambers, for providing separate transport paths between the chambers.

In another aspect, our invention is incorporated in a staged, vacuum-isolation processing system, and its method of operation, which achieves various of the above objectives and comprises: a multiplicity of isolatable communicating regions including at least a vacuum load lock chamber; a vacuum workpiece-processing chamber and an intermediate workpiece transport region; and vacuum means communicating with the isolatable regions for establishing a base vacuum level in the regions and a vacuum gradient across the system from region-to-region. Preferably, the workpiece transport region comprises first and second vacuum chambers, including respective first and second robot means therein for loading and unloading workpieces; and a pair of passages interconnecting the first and second robot-containing chambers for providing separate transport paths therebetween. First and second workpiece processing chambers or groups of such chambers can be provided in communication with the first and the second robot-containing chamber, respectively. These first and second processing chambers are isolated one from the other by the robot-containing chambers and passages and, consequently, can be used for processing at different vacuum levels and/or using incompatible gas chemistry, and without cross-contamination.

Preferably, our system includes first and second vacuum load lock chambers in communication with a first one of the robot-containing chambers for supplying and receiving workpieces. The dual load locks enhance throughput in that one can be open (to the atmosphere) for loading and unloading of workpieces, while the rest of the system is at vacuum and transporting workpiece internally and/or processing workpieces.

In another aspect of our invention, one or both of the passages includes a chamber therein for treating workpieces prior to transfer from one robot-containing chamber or transfer station to the other. For example, such chambers may be used for precleaning semiconductor wafers before they enter a high vacuum transfer station. This pre-treatment isolation decreases contamination of the transfer station and processing chambers, decreases vacuum pump down time, and, thus, increases throughput.

In another aspect, our invention is embodied in a staged-vacuum system which comprises a plurality of semiconductor wafer processing chambers; a wafer load/unload station preferably comprising two load lock chambers for supplying and receiving wafers; a plurality of chambers interposed between and providing a serial transfer path between the load/unload station and the processing chambers; and slit valves which are situated along the transfer paths and interposed between adjacent chambers for selectively sealing the chambers to isolate adjacent chambers one from the other. Also, a vacuum system communicates with the vacuum chambers for establishing a selected base vacuum level in each isolated chamber and a vacuum gradient across the system from chamber-to-chamber, thereby minimizing the time required to pump down the chambers to their selected base vacuum level.

In still another aspect, our invention is embodied in a multiple chamber staged-vacuum semiconductor wafer processing system, comprising a plurality of semiconductor wafer processing chambers; a wafer load/unload station preferably comprising two load lock chambers for supplying and receiving wafers; and a chamber housing including first and second wafer transfer chambers communicating with one another along a first path from the first wafer transfer chamber via a first intermediate processing chamber to the second wafer transfer chamber and along a second path from the second wafer transfer chamber via a second intermediate processing chamber to the first wafer transfer chamber. The load/unload station communicates with the first wafer transfer chamber and the semiconductor wafer processing chambers communicate with the second wafer transfer chamber to complete the system path from load/unload station to processing chambers.

In still another, method aspect, our present invention is embodied in a method of transporting workpieces in vacuo, comprising transferring selected workpieces from a first vacuum chamber to a second vacuum chamber along a first passageway interconnecting the chambers and returning selected wafers from the second to the first chamber via a second passageway interconnecting the chambers. In a particular aspect, the transfer chambers are robot chambers each of which is in communication with one or a group of vacuum processing chambers and which, along with the interconnecting passageways, effectively isolate one group of processing chambers from the other.

In yet another method aspect, our invention relates to a method of transporting workpieces through a vacuum system and comprises loading the workpieces at a vacuum load lock station; sequentially transferring the workpieces within the system through isolated regions of increasing vacuum levels to a vacuum processing chamber for selected processing of the workpiece; and upon completion of the selected processing, returning the wafer to the load lock station.

BRIEF DESCRIPTION OF THE DRAWINGS

The above and other aspects of our invention are described in the enclosed drawings in which:

FIGS. 3 and 4 are plan views of the robot and associated linkage showing the robot arm in the retracted position (FIG. 3) and in the extended position (FIG. 4).

DETAILED DESCRIPTION OF THE INVENTION

Figure 1:
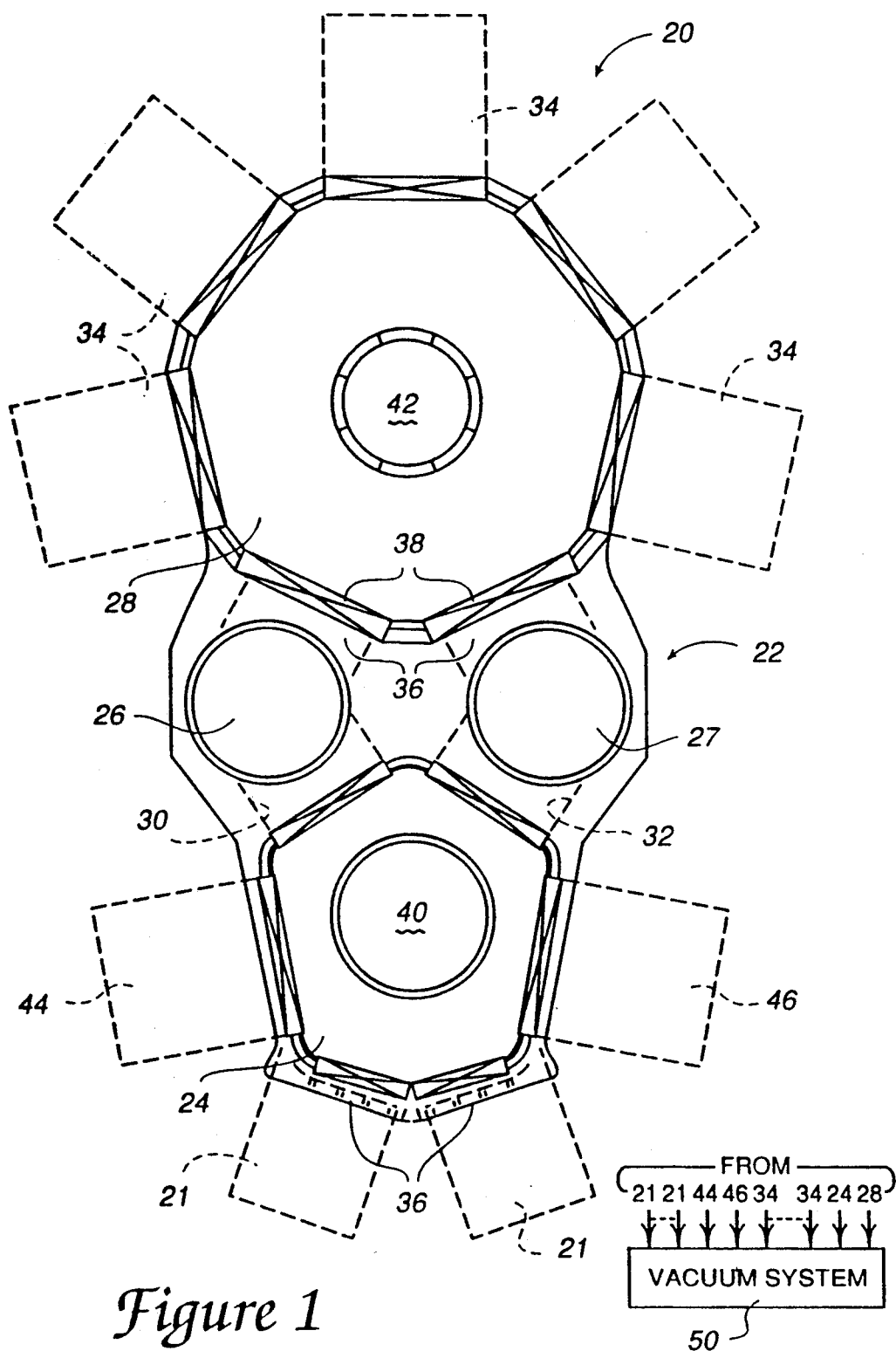
FIG. 1 is a schematized top plan view of a presently preferred embodiment of our staged-vacuum, multiple chamber semiconductor wafer processing system.

FIG. 1 is a schematic plan view of the configuration of a presently preferred embodiment 20 of our staged-vacuum semiconductor wafer processing system. The system includes a housing 22 which defines four chambers: a robot buffer chamber 24 at one end, a transfer robot chamber 28 at the opposite end, and a pair of intermediate processing or treatment chambers 26 and 27. Although one or more load lock chambers 21 may be used, preferably two such chambers are mounted to the buffer chamber and in communication with the interior of the buffer robot chamber via access ports 36 and associated slit valves 38. A plurality of vacuum processing chambers 34 (illustratively five) are mounted about the periphery of the transfer robot station. (As used here, "plurality" means two or more.) The chambers 34 may be adapted for various types of processing including etching and/or deposition. Access is provided to and between each of the chambers by an associated port 36 and gate valve 38.

The robot chambers 24 and 28 communicate with one another via the intermediate processing or treatment chambers 26 and 27 (also called "treatment" chambers). Specifically, intermediate treatment chamber 26 is located along a corridor or pathway 30 which connects the transfer robot chamber 28 to the buffer robot chamber 24. Similarly, the second intermediate treatment chamber 27 is located along a separate corridor or pathway 32 which connects the robots 28 and 24. These separate paths between the two robot or transfer chambers permit one path to be used for loading or unloading while the system is being used for wafer processing treatment and, thus, provide increased throughput. Please note, the chambers 26 and 27 can be dedicated to pre-treating (e.g., plasma etch cleaning and/or heating) of the wafers before processing in chambers 34 or post-treating (e.g., cool-down) of the wafers following treatment in chambers 34; alternatively, one or both of the chambers 26 and 27 can be adapted for both pre-treatment and post-treatment.

Preferably, the housing 22 is a monolith, i.e., it is machined or otherwise fabricated of one piece of material such as aluminum to form the four chamber cavities 24, 26, 27 and 28 and the interconnecting corridors or pathways 30 and 32. The use of the monolith construction facilitates alignment of the individual chambers for wafer transport and also eliminates difficulties in sealing the individual chambers.

One typical operational cycle of wafer transport through the system 20 is as follows. Initially, RΘ buffer robot 40 in chamber 24 picks up a wafer from a cassette load lock 21 and transports the wafer to chamber 26 which illustratively etch cleans the surface of the wafer. RΘ transfer robot 42 in chamber 28 picks up the wafer from the pre-cleaning chamber 26 and transfers the wafer to a selected one of the preferably high vacuum processing chambers 34. Following processing, transfer robot 42 can transfer the wafer selectively to one or more of the other chambers 34 for processing. Then, following use of this random access-type transfer capability, the transfer robot 42 transfers the wafer to intermediate processing chamber 27 which illustratively is a cool-down chamber. After the cool-down cycle, buffer robot 40 retrieves the wafer from the chamber 27 and returns it to the appropriate cassette load lock chamber 21.

As alluded to above, the system 20 is uniquely designed so that each chamber stage (main processing chambers 34/transfer robot chamber 24/intermediate processing chambers 26, 27/buffer robot chamber 24/load lock chambers 21) can be isolated from all the other chambers. None of the chambers or stages, with the exception of the cassette load lock(s) 21, is vented to atmosphere during processing. In addition, during wafer transfer, only two adjacent chambers need be in communication at any time. As a result, variations in vacuum level and, specifically, reductions in the vacuum level during wafer transfer can be minimized by using a vacuum pumping system 50, FIG. 1, to provide a vacuum gradient across the system from the cassette load lock 21 to the vacuum processing chambers 34. The staged vacuum is applied across the system with the degree of vacuum increasing in order from the cassette load locks 21 to the processing chambers 34. Consequently, the time required to pump down chamber 34 to its base vacuum level subsequent to the loading of a wafer therein is minimized and very high degrees of vacuum can be used in the processing chambers 34 without lengthy pump down times and, thus, without adversely affecting system throughput. Also, since the wafers can be pre-cleaned and/or pre-heated before entering high vacuum, there is less system contamination and throughput is increased.

In addition to the enhanced vacuum isolation, throughput and processing versatility provided by the intermediate stage chambers 26 and 27, the abovementioned stations or chambers 44 and 46 can be mounted on the buffer robot chamber 24 to provide still additional processing isolation, flexibility and throughput enhancement. For example, chamber 44 may be an orienter which is used to orient the wafer flats prior to processing. Alternatively, an entire cassette of wafers in load lock chamber 21 may be oriented one at a time preparatory to transfer to the processing chambers. Chamber 46 may also be dedicated to pre-processing treatment. Alternatively, one or both of the chambers 44 and 46 may be used for post-processing treatment, for both pre-processing and post-processing treatment, or for processing itself. These chambers 44 and 46 are very effectively isolated from the processing chambers 34 by the intervening individually isolated buffer chamber 24, transport paths 26 and 27 (and associated chambers) and transfer chamber 28. Thus, chambers 44 and 46 can be conveniently used for processes which require a different (and/or incompatible) chemistry and/or different (typically lower) pressure relative to the group of processing chambers 34. For example, the high degree of isolation facilitates the use of corrosive gas chemistry in the chambers 34 without affecting the atmosphere and processing/treatment in the chambers 44, 46, and vice versa.

In a presently preferred embodiment, buffer robot 40 is the dual four-bar link robot disclosed in allowed Maydan et. al. patent application, entitled "Multi-Chamber Integrated Process System", U.S. Ser. No. 283,015, now abandoned, which application is incorporated by reference. This robot is preferred for the use in the buffer chamber 24 in part because it combines a folded, very compact configuration and footprint with a relatively long reach and, thus, the capability to service the cassette load lock(s) 21, the buffer stage treatment/processing chambers 44, 46 and the intermediate stage processing treatment chambers 26, 27.

Figure 2:
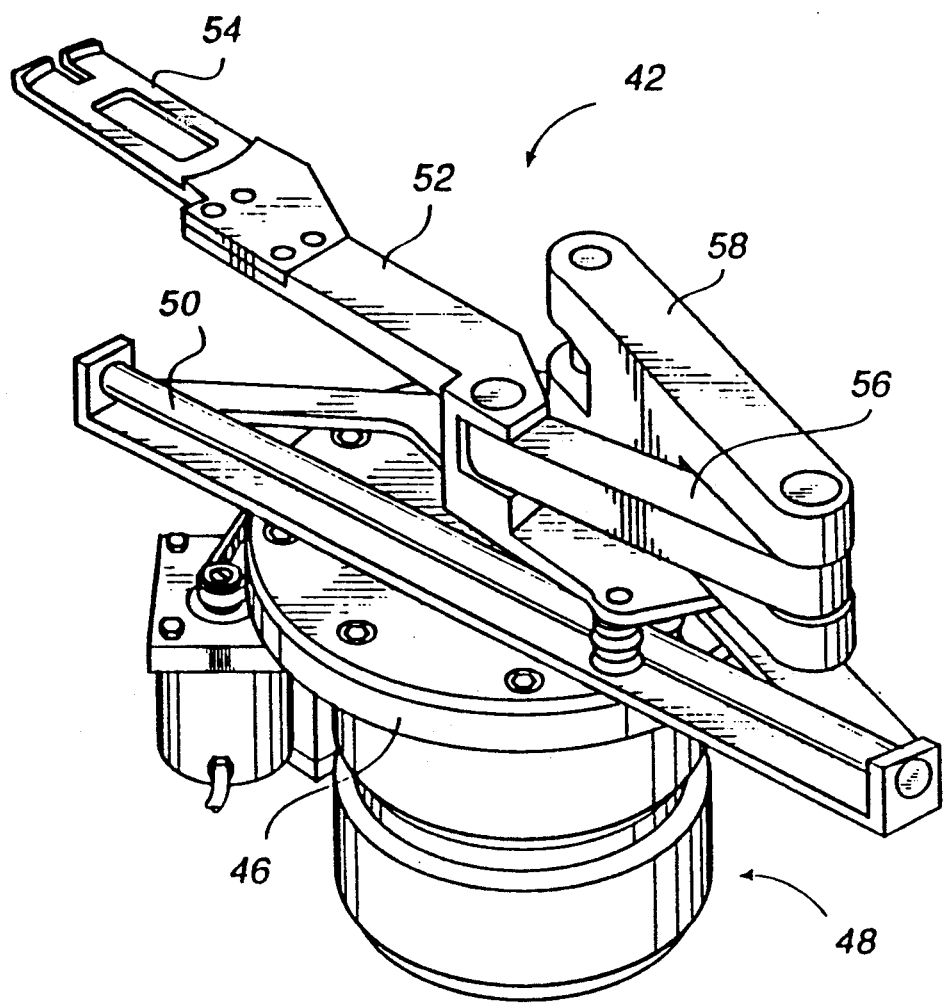
FIG. 2 is a perspective view of a presently preferred embodiment of a magnetically coupled co-axial drive robot used in the system of FIG. 1.
Figure 3A:
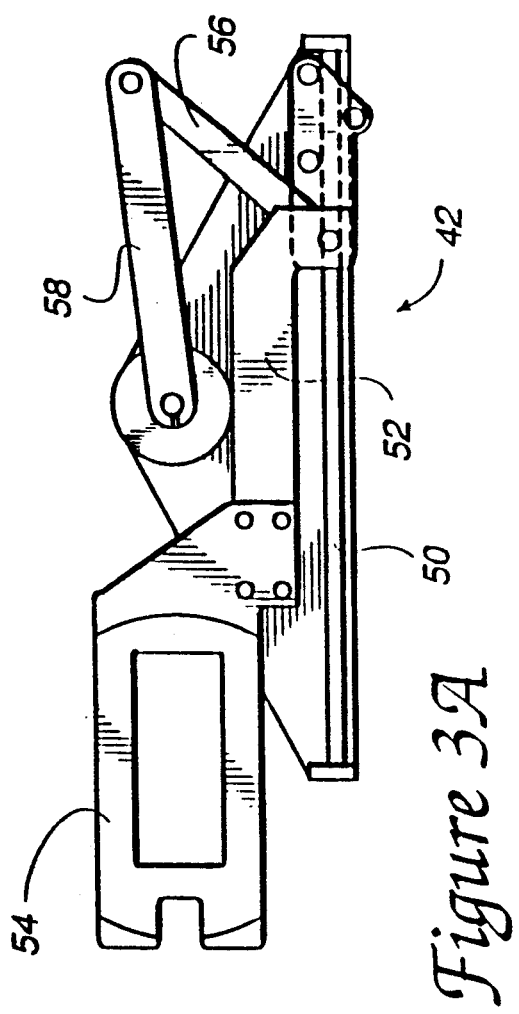
Figure 3B:
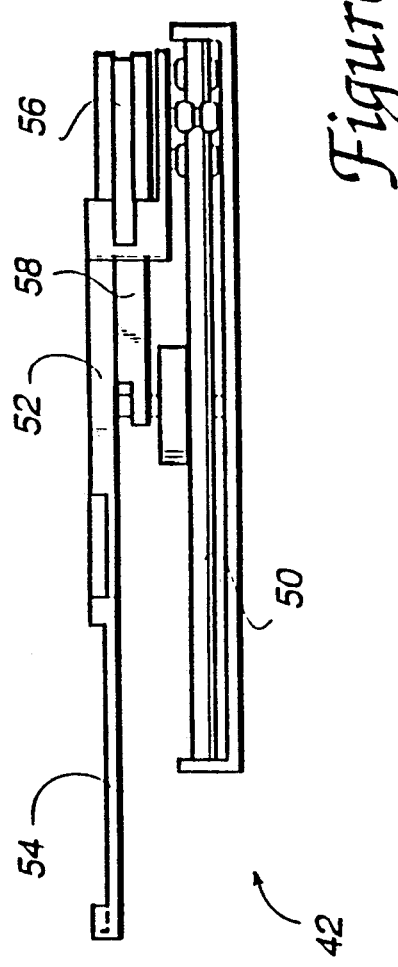

The presently preferred transfer robot 42 is depicted in FIGS. 2, 3 and 4. The prime criteria satisfied by this robot include, first, a long reach; secondly, minimization of the number of gears and other moving parts within the very high vacuum which is used in processes such as physical vapor deposition and; thirdly, effective sealing for such high vacuum environments. Robot 42 comprises a support plate 46 which is sealing mounted to the base plate of the robot cavity. A magnetic-coupling, concentric-shaft drive system 48 is mounted to the base plate external to the vacuum chamber 28 and incorporates rotational drive means which are magnetically coupled to concentric shafts (not shown) to effect the RΘ movement of the robot. A slide 50 is mounted on one of the concentric shafts and is reversibly rotated with that shaft to impart Θ movement to the robot. A wafer arm 52 having a wafer-holding pocket 54 at one end is mounted at the other end via a linkage system comprising pivot arms 56 and 58 to the second concentric shaft (not shown) of the magnetic-coupled drive system. Rotation of the second shaft in opposite directions pivots the links 56 and 58, thereby effecting R translational movement of the arm 54 between the retracted position shown in FIG. 3 and the extended position shown in FIG. 4.

Having thus described preferred and alternative embodiments of our present invention, it is understood that one of usual skill in the art will derive alternatives and variations which are within the scope of the invention.

We claim:

1. A staged vacuum-isolation processing system comprising: a multiplicity of isolatable communicating regions including at least a vacuum load lock chamber; a vacuum workpiece-processing chamber and an intermediate workpiece transport region; and vacuum means communicating with the isolatable regions for establishing a vacuum gradient of decreasing pressure across the system from load lock chamber to workpiece-processing chamber.

2. A workpiece transport system comprising first and second vacuum chambers and a pair of vacuum passageways interconnecting the first and second vacuum chambers and providing selectable isolation of, and separate workpiece transport paths between, the first and second vacuum chambers.

3. A workpiece transport system comprising first and second vacuum chambers, including respective first and second robot means therein for loading and unloading workpieces; and first and second vacuum passageways interconnecting the first and second robot-containing vacuum chambers for providing separate transport paths between said vacuum chambers.

4. The workpiece transport system of claim 3, further comprising valve means for isolating the first and second robot-containing vacuum chambers and the first and second vacuum passageways, one from the other.

5. The workpiece transport system of claim 4, further comprising vacuum load lock means including at least a first vacuum load lock chamber in communication with the first robot-containing vacuum chamber for supplying wafers to and receiving wagers from said first vacuum chamber; and at least one vacuum processing chamber connected to the second robot-containing vacuum chamber.

6. The workpiece transport system of claim 3 or 5, at least one of the first and second vacuum passageway further including a treatment chamber therein for treating workpieces prior to transfer from one of the first and second robot-containing vacuum chambers to the other.

7. The workpiece transport system of claim 6, further comprising at least a first and a second workpiece process chamber in communication, respectively, with the first and second robot-containing vacuum chambers; and valve means for isolating the first and second vacuum process chambers from their associated robot-containing chambers, whereby the atmosphere in the first vacuum processing chamber is isolated from the atmosphere in the second vacuum processing chamber via the intervening chambers and passageways.

8. A multiple chamber staged-vacuum semiconductor wafer processing system, comprising:

a plurality of semiconductor wafer processing chambers;

a wafer load/unload chamber for supplying and receiving wafers;

a plurality of chambers interposed between and providing a pair of transfer paths between the load/unload chamber and the processing chambers;

valve means situated along said transfer paths and interposed between adjacent chambers and selectively sealing said adjacent chambers to selectively isolate said adjacent chambers one from the other; and vacuum means communicating with the isolatable vacuum chambers for establishing a vacuum gradient of decreasing pressure across the system from load lock chamber to semiconductor wafer-processing chamber.

9. The staged vacuum semiconductor wafer processing system of claim 8, wherein the semiconductor wafer processing chambers are selected from deposition and etching chambers.

10. The staged vacuum semiconductor wafer processing system of claim 9, the semiconductor wafer processing chambers including at least a physical vapor deposition chamber.

11. A multiple chamber staged vacuum semiconductor wafer processing system, comprising:

at least a plurality of semiconductor wafer processing chambers;

a wafer load/unload station supplying wafers for processing in the processing chambers and receiving wafers from the processing chambers; and a chamber housing including first and second wafer transfer chambers communicating with one another along a first path from the first wafer transfer chamber to the second wafer transfer chamber via a first intermediate processing chamber and along a second path from the second wafer transfer chamber via a second intermediate processing chamber to the first wafer transfer chamber, the load/unload station being mounted to and communicating with the first wafer transfer chamber and the semiconductor wafer processing chambers being mounted to and communicating with the second wafer transfer chamber.

12. The multiple chamber staged vacuum semiconductor wafer processing system of claim 11, wherein the first intermediate chamber is adapted for semiconductor wafer cleaning.

13. The multiple chamber staged vacuum semiconductor wafer processing system of claim 11, wherein the first intermediate chamber is a wafer cool down chamber.

14. The multiple chamber staged vacuum semiconductor wafer processing system of claim 11, wherein the intermediate chambers are adapted for treating a wafer prior of subsequent to processing in the processing chambers.

15. The multiple chamber stage vacuum semiconductor wafer processing system of claim 11, the first and second wafer transfer chambers each having a robot mounted therein for respectively (1) reciprocally transferring wafers between the loading and unloading station and the intermediate chambers and (2) for reciprocally transferring wafers between individual ones of the processing chambers, and between the processing chambers and the intermediate chambers.

16. The multiple chamber staged vacuum semiconductor wafer processing system of claim 15, wherein the robot in the second or transfer station comprises a slide mounted within the chamber for horizontal reciprocal rotation; a wafer holding arm mounted on the slide for reciprocal sliding movement; a pair of co-axial shafts, a first one of the shafts connected to the slide for imparting reciprocal $\theta$ rotation to the slide and the second shaft being connected via link means to the wafer arm for translating reciprocal rotational movement of said shaft into reversible R translation of said wafer arm.

17. A staged vacuum semiconductor wafer processing system comprising:
(1) a multiplicity of vacuum processing chambers;
(2) wafer queuing load lock chamber means for imputing wafers to and retrieving wafers from the system;
(3) a multiplicity of vacuum processing and transfer stations interposed between and providing a serial transfer path between the load lock chamber means and the processing chambers;
(4) valve means situated along said transfer path and interposed between adjacent chambers and selectively sealing said chambers to isolate said adjacent chambers one from the other and thereby form a serial array of isolated vacuum stations of said chambers; and
(5) vacuum means for establishing a selected base vacuum level in the separate isolated vacuum stages and a vacuum gradient of decreasing pressure across the system from load lock chamber means to the vacuum processing chambers, thereby reducing the time required to pump down each chamber to its selected base vacuum level.

18. A staged-vacuum semiconductor wafer processing system, comprising:
(1) a chamber housing including a first relatively small robot chamber and a second relatively large robot chamber, the robot chambers communicating with one another via a pair of intermediate chambers, along a first path from the first robot via a first intermediate chamber to the second robot chamber and along a second path from the second robot chamber via a second intermediate chamber to the first robot chamber;
(2) load lock means mounted on the first robot chamber;
(3) at least a plurality of vacuum processing chambers mounted on the second robot chamber;
(4) the first robot chamber having a robot mounted therein for reciprocally transferring wafers between the load lock means and said intermediate chambers;
(5) the second robot chamber having a robot mounted therein for reciprocally transferring wafers between the processing chambers and between the processing chambers and the intermediate chambers;
(6) access ports between and for providing communication between (a) the individual process chambers and the second robot chamber, (b) the second robot chamber and the two intermediate chambers, (c) the two intermediate chambers and the first robot chamber, and (d) the first robot chamber and the load lock means;
(7) valve means for selectively opening and closing said access ports;

(8) vacuum means for selectively providing a staged vacuum in the system with a relatively low degree of vacuum in the load lock means and a relatively high degree of vacuum in the processing chambers; and (9) computer means for controlling processing within the vacuum processing chambers and selectively transferring wafers from said load lock means via the first path to selected vacuum processing chambers and from selected vacuum processing chambers via the second path to the load lock means.

19. The staged-vacuum semiconductor wafer processing system of claim 18, wherein the valve means selectively isolated the vacuum chamber or stages, and wherein the vacuum means establishes a selected base vacuum level in each chamber and a vacuum gradient across the system from chamber-to-chamber, thereby reducing the time required to pump down each chamber to its selected base level.

20. A method of transporting workpieces in vacuo, comprising transferring selected workpieces from a first vacuum chamber to a second vacuum chamber along a first passageway interconnecting the chambers and returning selected wafers from the second to the first chamber via a second passageway interconnecting the chambers.

21. The transporting method of claim 20, wherein the first and second vacuum chambers are robotic workpiece transfer chambers each of which is in communication with one or more vacuum processing or treatment chambers.

22. A method of transporting a workpiece through a vacuum system comprising loading a workpiece at a vacuum load lock chamber means; sequentially transferring the workpiece within the system through isolated regions of increasing vacuum levels to a vacuum processing chamber for selected processing of the workpiece; and upon completion of the selected processing, returning the workpiece to the load lock chamber means.

23. The system of claim 1, wherein the intermediate workpiece transport region comprises: first and second vacuum, workpiece transfer chambers connecting with one another along a first path between the first workpiece transfer chamber and the second workpiece transfer chamber via a first intermediate vacuum processing chamber and along a second path between the first workpiece transfer chamber and the second workpiece transfer chamber via a second vacuum intermediate processing chamber; the load lock chamber communicating with the first workpiece transfer chamber; and the workpiece-processing chamber communicating with the second workpiece transfer chamber.

* * * * *